(12) United States Patent
Sutardja

(10) Patent No.: US 8,383,962 B2
(45) Date of Patent: Feb. 26, 2013

(54) EXPOSED DIE PAD PACKAGE WITH POWER RING

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 380 days.

(21) Appl. No.: 12/731,782

(22) Filed: Mar. 25, 2010

(65) Prior Publication Data

US 2010/0259908 A1 Oct. 14, 2010

Related U.S. Application Data

(60) Provisional application No. 61/167,726, filed on Apr. 8, 2009.

(51) Int. Cl.
*H01L 23/495* (2006.01)

(52) U.S. Cl. ........ 174/529; 174/530; 174/536; 174/538; 361/723

(58) Field of Classification Search ............ 174/520, 174/521, 527–533, 536, 538; 257/666, 672, 257/676, E23.043, E23.031, E23.05, E23.052; 361/723, 704

See application file for complete search history.

(56) References Cited

U.S. PATENT DOCUMENTS

| | | | |
|---|---|---|---|
| 7,064,420 B2 * | 6/2006 | Han et al. | 257/669 |
| 8,067,821 B1 * | 11/2011 | Choi et al. | 257/666 |
| 2004/0061205 A1 * | 4/2004 | Han et al. | 257/666 |
| 2006/0289973 A1 * | 12/2006 | Lee | 257/666 |
| 2008/0258278 A1 * | 10/2008 | Ramos et al. | 257/676 |
| 2009/0166842 A1 * | 7/2009 | Lee | 257/690 |
| 2010/0001384 A1 * | 1/2010 | Bathan et al. | 257/676 |

* cited by examiner

*Primary Examiner* — Hoa C Nguyen

(57) ABSTRACT

A packaged semiconductor is disclosed. The packaged semiconductor comprises a conductive integral frame that includes an inner portion and a ring portion encircling the inner portion, a semiconductor die that is mounted to a first surface of the inner portion of the conductive frame, and a casing that supports the conductive frame and covers the semiconductor die. Sections of the conductive frame that connect the inner portion to the ring portion are removed after the casing is applied to the conductive frame.

19 Claims, 9 Drawing Sheets

EXPOSED DIE PAD PACKAGE WITH POWER RING

CROSS-REFERENCE TO RELATED APPLICATIONS

This application claims the benefit of U.S. Provisional Application No. 61/167,726, filed on Apr. 8, 2009. The disclosure of the above application is incorporated herein by reference in its entirety.

FIELD

The present disclosure relates to semiconductor packaging and more particularly to exposed die pad packages including a power ring.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices are generally manufactured on a silicon wafer. Each silicon wafer undergoes various processing steps to create multiple individual devices on the wafer. Each device on the wafer is referred to as a die. When the wafer is complete, the wafer is divided into the individual dies (or, dice). For example only, this dividing may be performed by sawing or by scoring and snapping.

The dice are generally vulnerable to their environment. For example only, the dice are physically fragile and prone to cracking and breaking when being handled. In addition, the dice are prone to contamination, both by physical contact as well as by airborne particles. The dice are also very sensitive to electrostatic discharge. For these and other reasons, the dice are often packaged. The packaged dice, or chips, are much easier to handle and may be easier to use in applications such as printed circuit boards.

A package may include one die or may include multiple dice. For ease of explanation, the following description will refer to a single die, although the present application applies to the packaging of multiple dice into a single package.

An exemplary package includes a first package piece to which the die is mounted. The first package piece includes a first face and a second face. The first face includes a die attach area where the die is placed. The second face may include features for electrically and mechanically connecting the package to a printed circuit board. Leads carry electrical signals from the die to the printed circuit board. Portions of the leads may be located on the first face of the first package piece.

When the die is secured to the die attach area of the first package piece, wire bonds may be formed between bond pads of the die and the leads. The leads may be bent so that they wrap around the edges of the first face and protrude past the second face. The leads can therefore be inserted into through-holes of a circuit board. Often, leads are attached to two opposing edges of the first face. This creates two rows of protruding leads, and the package is called a dual inline pin (DIP) package.

Through-holes may make circuit board layout more difficult and may prevent components from being placed on both sides of the circuit board. Surface mounting technology, where leads do not protrude through the circuit board, avoids these problems. The leads of a surface-mount package are generally bent to be parallel to the second face, and therefore present flat contacting surfaces to corresponding receiving pads on the circuit board.

Traditionally, leads have been located around the perimeter of the package. This is because the die occupies the center of the package and the bond wires connect outward from the die to the perimeter of the package. A surface-mounted version of the DIP package is a small-outline integrated circuit (SOIC), where the leads are bent outward when they reach the second face to form a gull-wing shape.

When the package has leads on all four edges, the package may be referred to as a quad flat package (QFP). When the leads do not extend beyond the edges of the package, the package may be referred to as a quad flat no-leads package (QFN). Some QFN packages include a central pad on the second face that dissipates thermal energy from the package to the circuit board.

To allow for greater connection density, leads may be formed in the interior area of the second face of the package. Internal wiring of the package may route signals from where bond wires connect at the perimeter of the package on the first surface to interior leads on the second surface of the package.

As described above, the face of the die has traditionally been exposed and bond wires connect the exposed bond pads of the die to leads of the package. In flip-chip packaging, the die is inverted onto the package, causing the bond pads of the die to contact the first face of the package. Then, the die can be designed to include bond pads in the center of the die, which will be located above the center of the package. This decreases the need for special conductors within the package that route signals from the perimeter of the first face to the center of the second face.

In one example, package leads are in the form of pins; such a package is called a pin grid array (PGA). Pin grid array packages may mount to a socket that is surface-mounted to the circuit board. In another example, the package includes an array of pads that connects to an array of pads on the circuit board. A ball of solder may be placed on each of the package pads; such a package is called a ball grid array (BGA).

A land grid array package includes pads that interface with pads on the circuit board. However, the land grid array package does not include balls of solder on the package pads. Instead, the circuit board may have a layer of solder on the pads. The solder may be restricted to the pad locations by using a mask when applying the solder. Once the package is positioned on the circuit board, the solder can be reflowed to secure each of the package pads to each of the receiving pads of the circuit board.

Alternatively, a socket may be connected to the circuit board. The socket applies clamping force to the package. This clamping force can either force the package pads to contact pads of the circuit board or cause the package pads to contact pads of the socket. A socket may allow for easy replacement of the package.

Once the die is mechanically and electrically connected to the first piece of the package, the die is covered. This isolates the die and any other components, such as bond wires, from the environment. The die may be covered by attaching a second package piece, such as a lid, to the first piece of the package. The first and second pieces may be sealed to prevent any contaminants from entering the space where the die is located.

SUMMARY

A packaged semiconductor is disclosed. The packaged semiconductor comprises a conductive integral frame that includes an inner portion and a ring portion encircling the inner portion, a semiconductor die that is mounted to a first surface of the inner portion of the conductive frame, and a casing that supports the conductive frame and covers the semiconductor die. Sections of the conductive frame that connect the inner portion to the ring portion are removed after the casing is applied to the conductive frame.

The ring portion includes a continuous first ring portion that encircles at least three sides of the inner portion. In one embodiment, the continuous first ring portion completely encircles the inner portion.

In one embodiment, the ring portion includes a first bar portion on a fourth side of the semiconductor die. The first bar portion is insulated from the first ring portion. In another embodiment, the ring portion further includes a second bar portion on the fourth side of the semiconductor die. The first bar portion, the second bar portion and the first ring portion are insulated from each other.

In one embodiment, the first surface of the inner portion defines a first plane. The ring portion is formed co-planar with the first plane. In another embodiment, the inner portion includes an elevated ring that is formed in a second plane. The second plane is parallel to and spaced apart from the first plane.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 2:
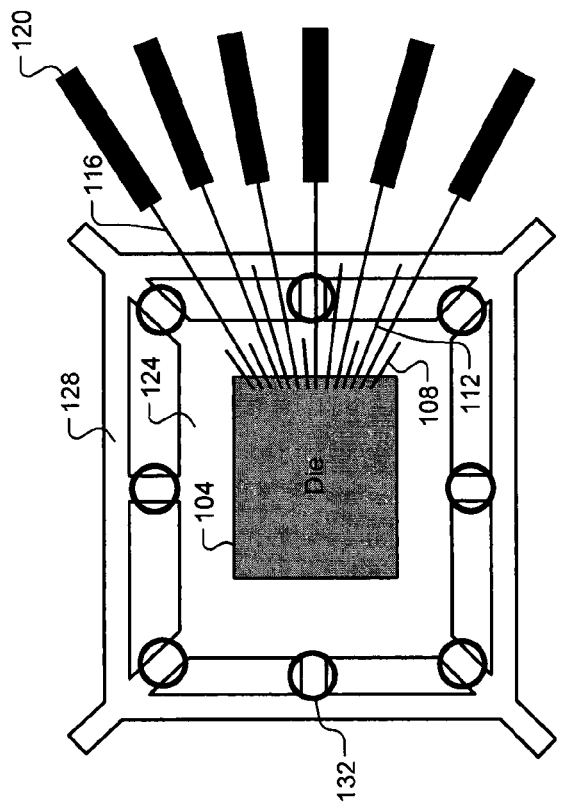
FIGS. 1-2 are partial top views of an exemplary packaged die according to the principles of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

Figure 1:
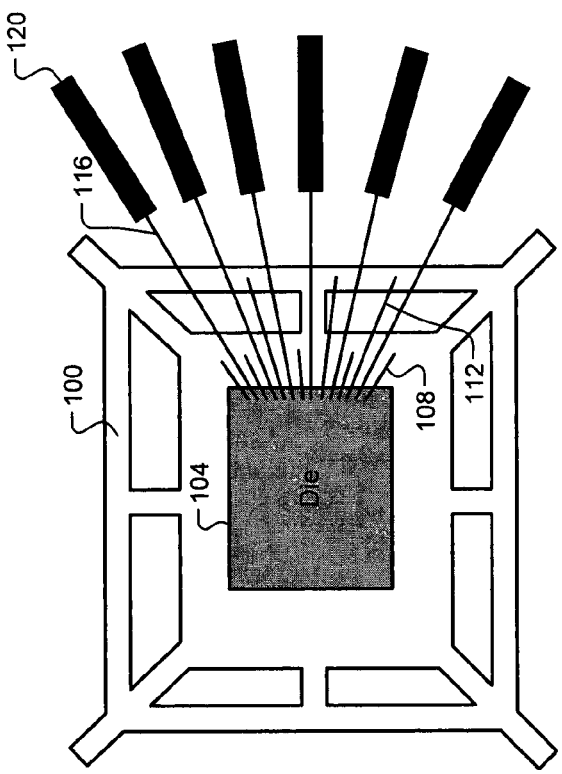

Referring now to FIG. 1, a partial top view of a package is shown. The package includes a conductive lead frame 100. For example, the frame 100 may be made of metal, and may be formed by stamping a sheet of metal. Once the frame 100 is formed, a die 104 is mounted to the frame 100. The die 104 may be mounted directly to the frame 100 or to an intermediary layer (not shown). For example only, the intermediary layer may be an insulator to prevent shorts between the die 104 and the frame 100.

In various implementations, it may be desirable for a face of the die 104 that contacts the frame 100 to be electrically continuous. For example only, the face of the die 104 may include ground connections, and the conductive frame 100 can therefore decrease the resistance between the ground connections.

The die 104 may also be connected to the frame 100 via bond wires 116, such as bond wires 108 and 112. In addition, bond wires 116 may electrically connect the die 104 to bond fingers 120 of the package. For ease of illustration, only some of the bond fingers 120 are shown. The bond fingers 120 may be present on all four sides of the frame 100, or may be limited to one or more sides.

Once bond wires are connected, the die 104 is enclosed in a casing (shown in FIG. 4A) that secures the frame 100. The casing may include an encapsulating material, such as epoxy, plastic, or resin, and may be applied using an injection molding process.

Referring now to FIG. 2, it may be desirable to split the frame 100 into two pieces to, for example, create a ground plane 124 and a power ring 128. The ground plane 124 can provide ground connections to the die 104 via bond wires such as the bond wires 108 and/or through direction connection to the die 104. The power ring 128 may provide operating power to the die 104, such as via the bond wires 112.

In order to electrically separate the power ring 128 from the ground plane 124, connecting sections 132 indicated by circles may be removed. Removal of the connecting sections 132 is performed after the frame 100 and the die 104 have been encased. In this way, disconnected sections of the frame 100 are fixed in place by the casing. Removal of the connecting sections 132 may be effected using any of a number of appropriate milling techniques and/or equipment including, for example, lasers, router bits, saw blades, etc. For example, where higher cutting precision is desired (such as, in the case of a localized trench or cut), lasers, router bits or small-diameter saw blades may be used; on the other hand, where lower cutting precision is sufficient (such as, in the case where one side of the frame 100 is cut), large-diameter saw blades may be used.

Figure 3B:
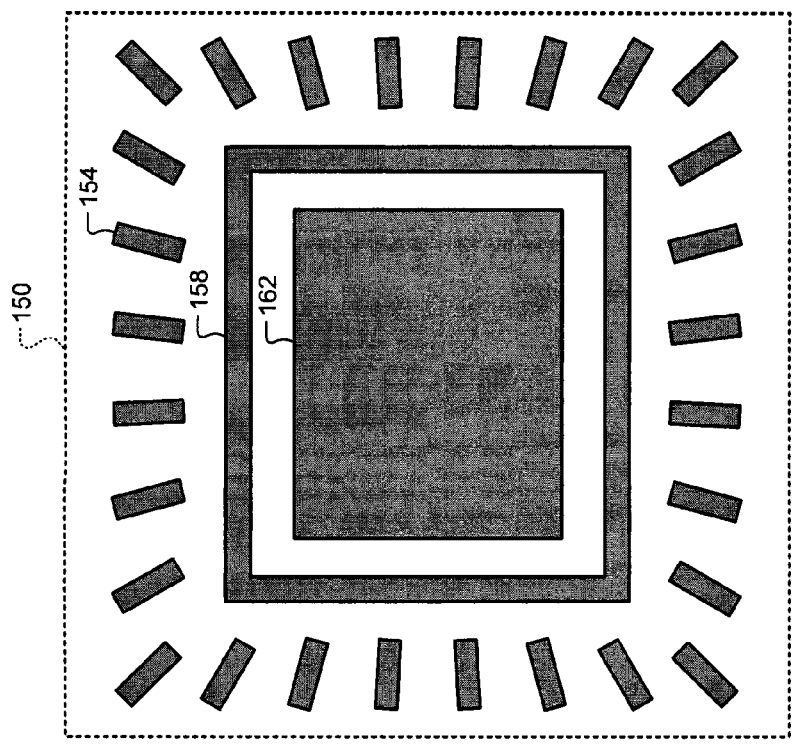
FIG. 3B is an exemplary top view of a printed circuit board contact pattern corresponding to the packaged die of FIG. 3A.
Figure 3A:
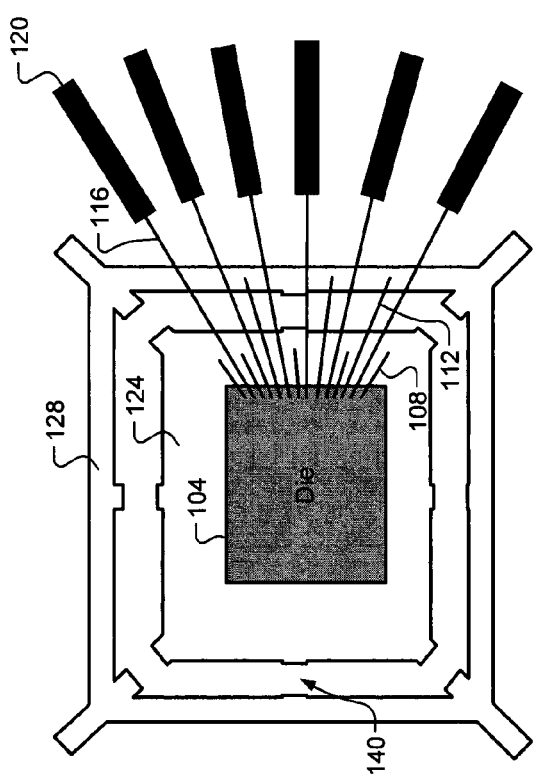
FIG. 3A is an exemplary partial top view of the packaged die of FIG. 1 at a later stage of manufacturing.

Referring now to FIG. 3A, the power ring 128 is shown separated from the ground plane 124. For example, a cavity 140 is present where one of the connecting sections 132 of the frame 100 was previously located. Removing the connecting sections 132 means that the connecting sections 132 no longer conduct electricity between different portions of the frame 100. For example only, the connecting sections 132 may be completely removed. Alternatively, vestigial pieces of the connecting sections 132 may remain, such as is shown in FIG. 3A. It should be further noted that while the edges of the cavity 140 shown in FIG. 3A are straight, such edges may also be round or curved, depending on the type of technique and/or equipment that is used to perform the removal.

Material from the frame 100 may be removed by any suitable process. For example only, mechanical removal, chemical etching, or laser removal may be performed. Mechanical removal may be performed using, for example only, a router, a saw, a drill, or a high pressure stream of fluid. Chemical etching may include using photolithography to define the portions of the frame 100 that will be removed.

Referring now to FIG. 3B, a contact pattern 150 may be formed on a printed circuit board to receive the packaged die of FIG. 3A. The contact pattern 150 includes lead contact areas 154, ring contact area 158, and plane contact area 162. Each of the lead contact areas 154 allows an electrical connection with one of the bond fingers 120. The ring contact area 158 allows an electrical connection with the power ring 128, and the plane contact area 162 similarly allows an electrical connection with the ground plane 124.

The contact pattern 150 may be modified based on the arrangement of the packaged die that will be mounted to the printed circuit board. In various implementations, the contact pattern 150 may accommodate multiple types of packaged dies. For example only, some packaged dies may not include a bond finger corresponding to each of the lead contact areas 154. In another example, the ground plane 124 of some packaged dies may be smaller than the plane contact area 162.

Solder may provide an electrical and a physical connection between the contact pattern 150 and the packaged die. Each contact area of the contact pattern 150 may be connected to a trace on the printed circuit board. For example only, a multi-layer printed circuit board may include a ground plane. The ground plane may be connected to the plane contact area 162, such as through an array of vias.

Figure 4A:
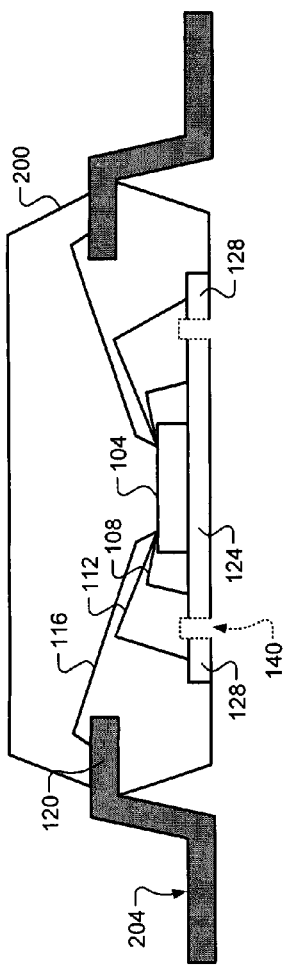
FIG. 4A is a cross-sectional view of an exemplary implementation of the packaged die of FIG. 3.

Referring now to FIG. 4A, a cross-sectional side view of the packaged die of FIG. 3A is shown. The die 104 is shown surrounded by a casing 200. As described above, the casing 200 may include one or more pieces, or may be a coating applied to the die 104. In FIG. 4A, the bond fingers 120 are part of leads 204. The lead 204 may be formed from a continuous piece of material, such as metal, or may be formed from a joining of multiple pieces. The lead 204 may be formed in the shape shown in FIG. 4A by bending, which may be performed before or after mounting the die 104 to the frame 100.

Figure 4B:
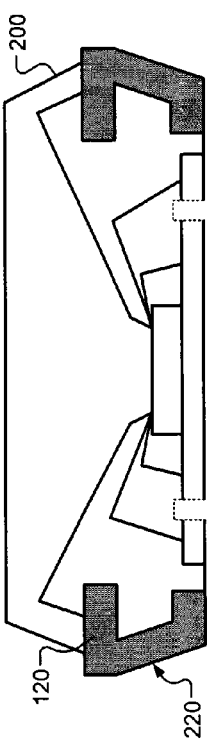
FIGS. 4B-4D are cross-sectional views of additional exemplary implementations of packaged dies.

In the example of FIG. 4A, the lead 204 extends from the edge of the casing 200. Various other lead structures are possible. Three further examples are given in FIGS. 4B, 4C, and 4D. In FIG. 4B, lead 220 is bent so that the bottom portion of the lead 220 remains within the confines of the casing 200, as viewed from a top view. This may reduce the amount of space required for the packaged chip on the circuit board.

Figure 4D:
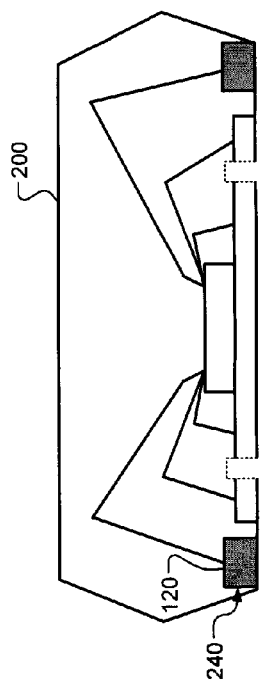
Figure 4C:
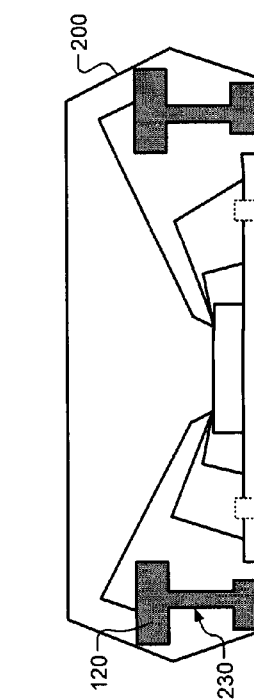

In FIG. 4C, lead 230 is enclosed by the casing 200. The bond finger 120 portion of the lead 230 may be connected to a bottom portion of the lead 230 using a through-hole, or via. In FIG. 4D, a lead 240 is located on the bottom of the casing 200. The bond finger 120 may serve as not only the seat of the bond wire, but also as the portion of the lead 240 that will contact the circuit board.

Returning now to FIG. 4A, the ground plane 124 and the power ring 128 are exposed at the bottom of the casing 200. The ground plane 124 and the power ring 128 may be flush with the bottom surface of the casing 200 or may protrude beyond the bottom surface of the casing 200. This may allow for more reliable seating against a circuit board that is not perfectly flat.

Although a true cross-section may show only a single one of the bond wires, for purposes of illustration, bond wire 108, bond wire 112, and bond wire 116 are all shown in FIG. 4A. The cavity 140 between the ground plane 124 and the power ring 128 is created to separate the power ring 128 from the ground plane 124. This cavity may be filled with additional encapsulating material. For example only, the cavity 140 may be filled with the same compound of which the casing 200 is made.

A further packaging process step may include trimming the leads 204 to reduce their protrusion beyond the edges of the casing 200. In addition, the leads 204 may be plated for corrosion resistance and more reliable electrical connection. The leads 204 may be flexible to increase the reliability of connections to a circuit board that is less than perfectly flat.

Although labeled as ground and power for ease of explanation, the ground plane 124 and the power ring 128 may carry other signals between the die 104 and the circuit board. For example only, the roles may be reversed, with power being provided to the die 104 via the ground plane 124 and a ground connection being provided by the power ring 128.

In another example, negative and positive power supplies, or vice versa, may be provided by the ground plane 124 and the power ring 128, respectively. Ground connections may then be provided by one or more of the leads 204. In yet another example, one of the ground plane 124 and the power ring 128 may provide input power to the die 104, while the other carries output power. For example, such an arrangement may be used when the die 104 is a voltage regulator or converter.

Figure 6:
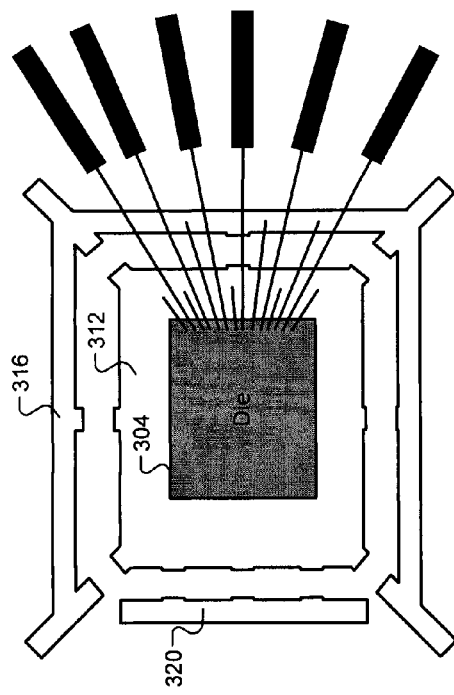
FIGS. 5-10 are partial top views of exemplary packaged dies.
Figure 8:
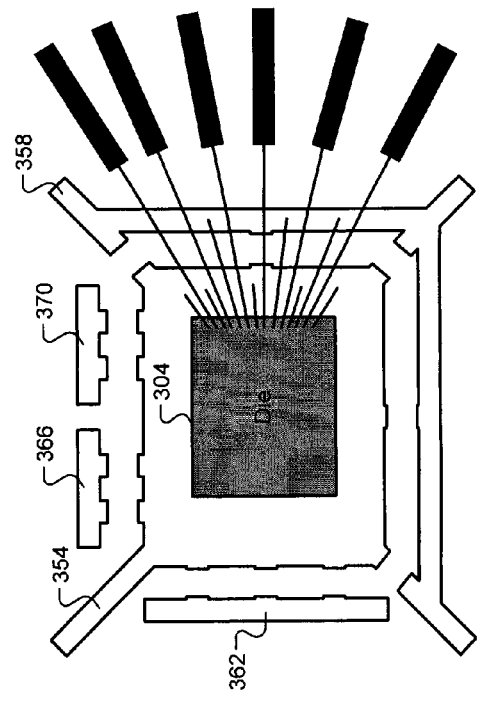
Figure 5:
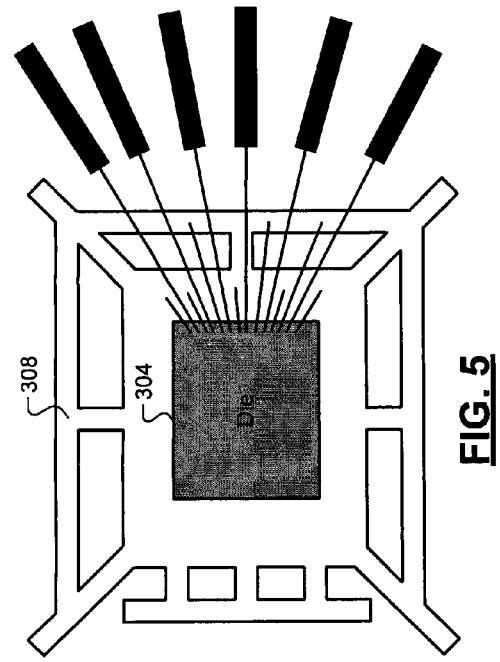

Referring now to FIG. 5, a die 304 is connected to a frame 308. When connecting portions of the frame 308 are removed, the resulting structure is shown in FIG. 6. The frame 308 is seen to be split into a plane 312, a partial ring 316, and a bar 320. For clarity of illustration, bond wires connecting the die 304 to the bar 320 are not shown. In addition, additional bond wires may connect the die 304 to additional portions of the partial ring 316. For example only, bond wires may radiate from the die 304 in all directions.

The plane 312, the partial ring 316, and the bar 320 can be used to carry any signals to and from the die 304. In one example, the plane 312 provides ground connections to the die 304. The partial ring 316 provides analog power to the die 304, and the bar 320 provides digital power to the die 304. This may reduce the amount of power supply noise introduced from the digital componentry of the die 304 into the analog componentry of the die 304 and vice versa.

Figure 7:
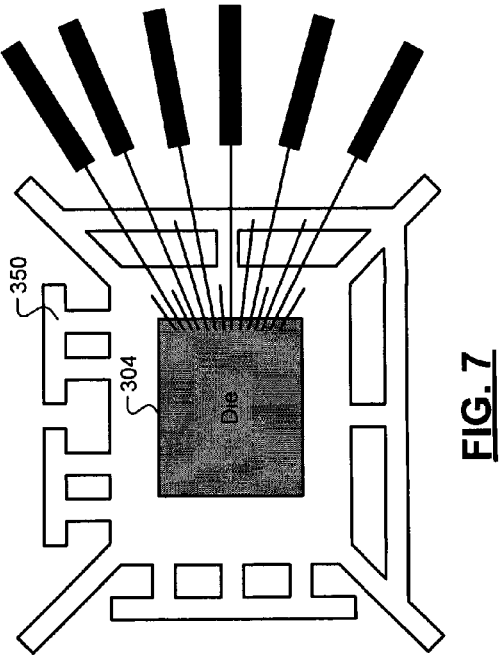

Referring now to FIG. 7, another frame 350 is shown. When connecting sections are removed, a plane 354, a partial ring 358, a bar 362, and two sub-bars 366 and 370 are formed. Although shown as separately formed in FIG. 7, sub-bars 366 and 370 may initially be connected together. The connecting portion can be removed as part of the packaging process.

For example only, the plane 354 may provide a ground connection to the die 304. As used in this application, ground means a common potential that may or may not be the same as earth ground. The common potential may be connected to a system ground of a system in which the die 304 is used. The partial ring 358 may provide analog power to the die 304, while the bar 362 provides digital power to the die 304.

The sub-bars 366 and 370 may provide additional power supplies to the die 304. For example only, the sub-bars 366 and 370 may provide power at different voltages than that provided by the bar 362 or the partial ring 358. For example only, the power supplied by the sub-bars 366 and 370 may be for input/output circuitry operating at two different voltage levels. This may allow the die 304 to interface with components that each operate at different voltages than the internal circuitry of the die 304.

Figure 9:
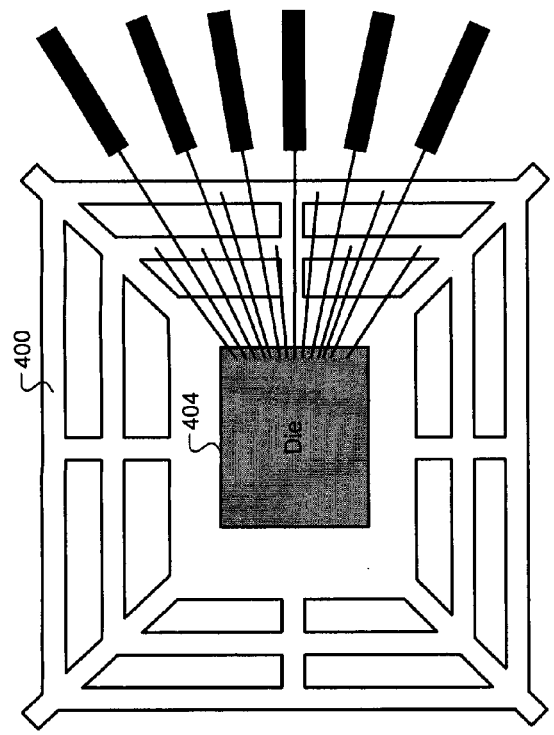
Figure 10:
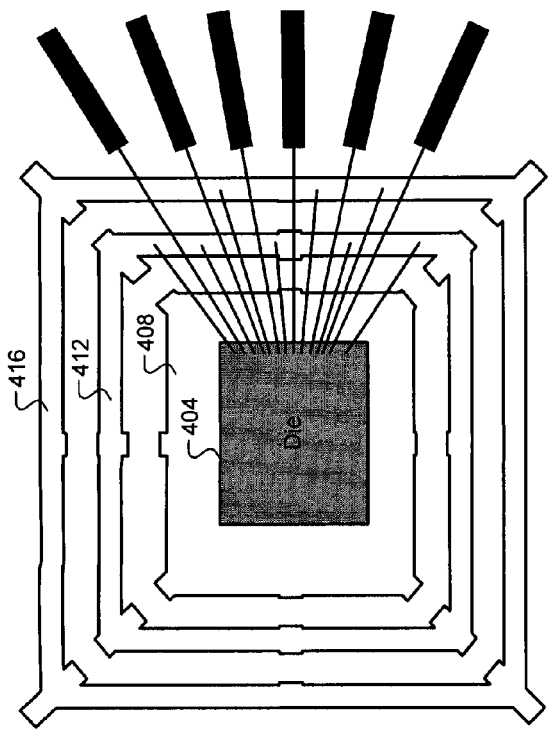

Referring now to FIG. 9, a frame 400 is shown. When connecting portions of the frame 400 are removed, the resulting structure is shown in FIG. 10. In FIG. 10, a plane 408 and concentric inner and outer rings 412 and 416 are created. The die 304 may connect directly to the plane 408 or may connect via bonding wires (not shown).

Figure 11:
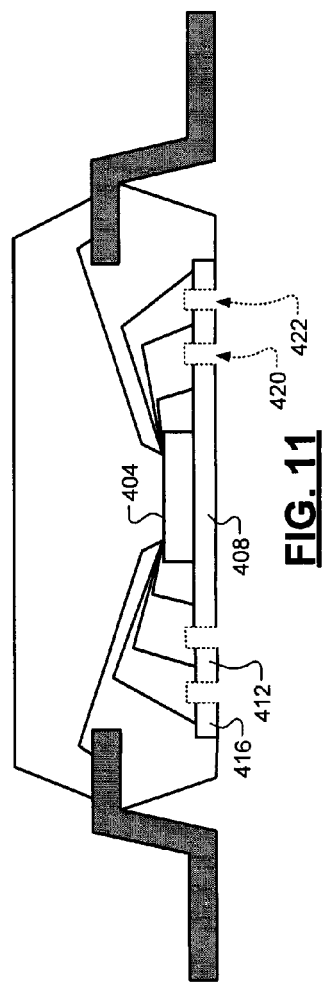
FIG. 11 is a cross-sectional view of an exemplary implementation of the packaged die of FIG. 10.

Referring now to FIG. 11, a cross-sectional view of the package of FIG. 10 is shown. Gaps 420 and 422 result from separating the inner ring 412 from the plane 408 and the outer ring 416.

Figure 12:
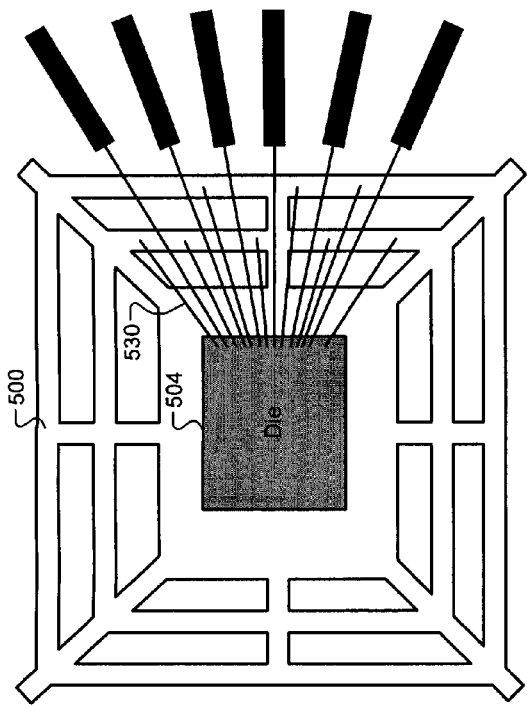
FIGS. 12-13 are partial top views of exemplary packaged dies.
Figure 13:
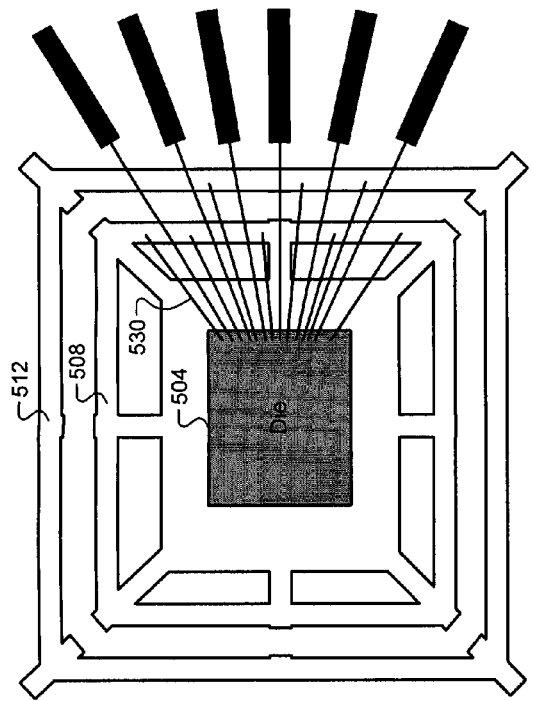

Referring now to FIG. 12, a frame 500 is shown. The frame 500 appears similar to the frame 400 of FIG. 9 in this top view. As shown in FIG. 13, only some interconnecting portions are removed from the frame 500. The resulting portions of the frame 500 form a plane/ring 508 and a ring 512.

Figure 14:
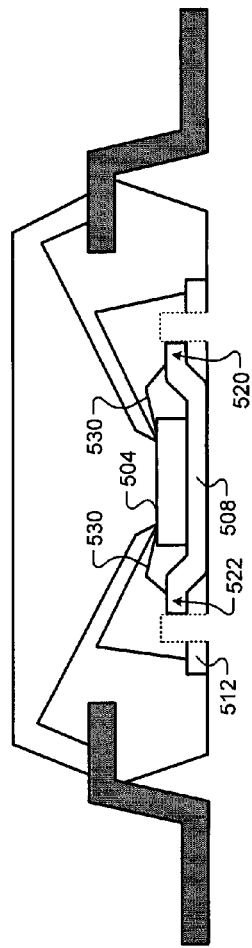
FIG. 14 is a cross-sectional view of an exemplary implementation of the packaged die of FIG. 13, which includes an elevated ring.

Referring now to FIG. 14, differences between the frame 500 of FIG. 12 and the frame 400 of FIG. 9 can be seen. The plane/ring 508 includes an elevated ring, as seen at 520 and 522. Bond wires 530 connect the die 504 to the elevated ring portion of the plane/ring 508. Elevating the ring may make the wire-bonding faster, cheaper, or less error-prone, and may result in more reliable wire bonds.

Figure 16:
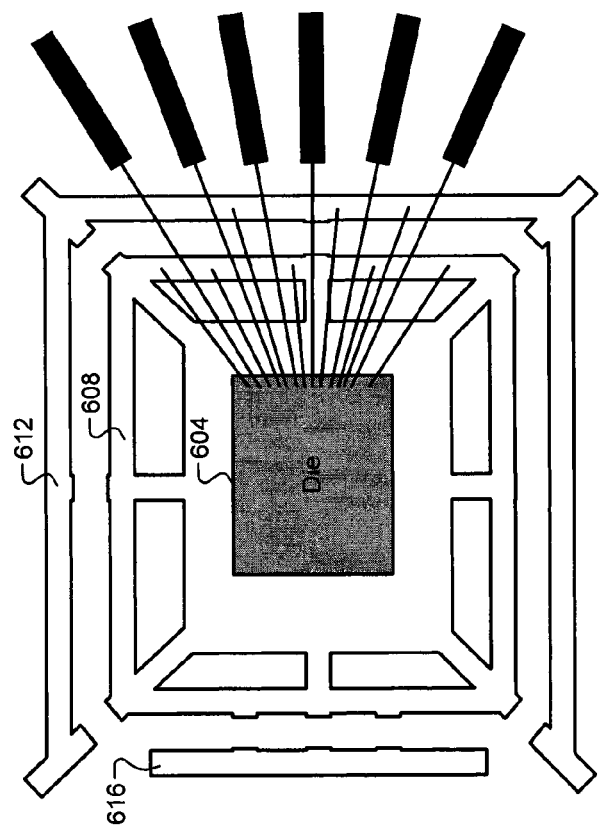
FIGS. 15-22 are partial top views of exemplary packaged dies.
Figure 15:
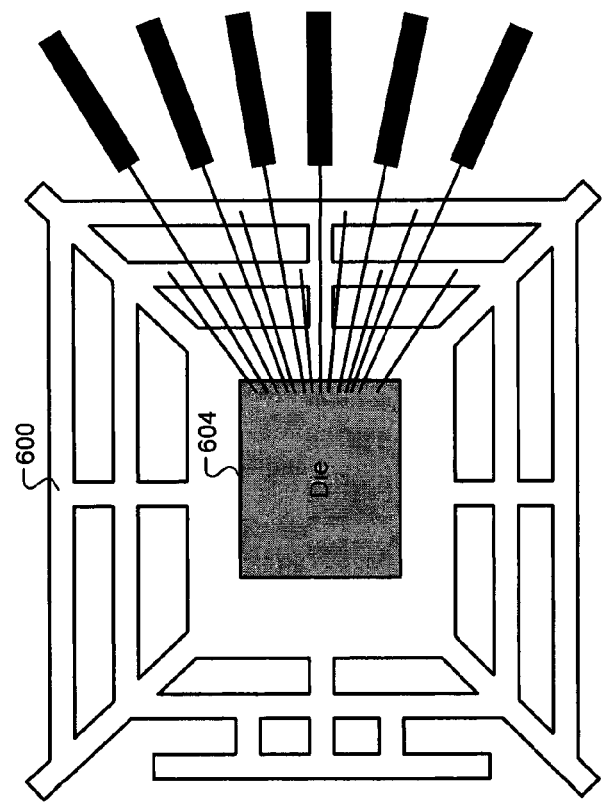

Referring now to FIG. 15, a frame 600 is shown with a die 604. In FIG. 16, some interconnecting portions of the frame 600 have been removed to create a plane/ring 608, a partial ring 612, and a bar 616. The ring portion of the plane/ring 608 may be elevated, as shown in FIG. 14.

Figure 18:
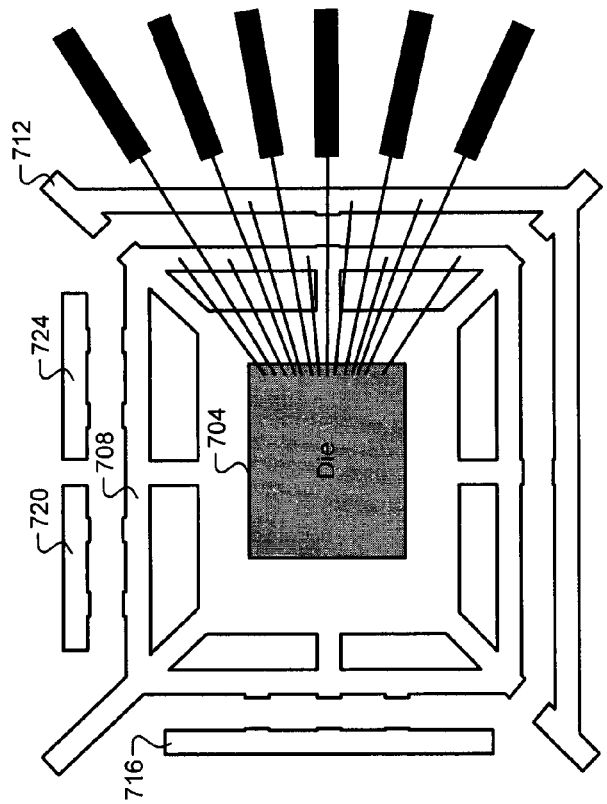
Figure 17:
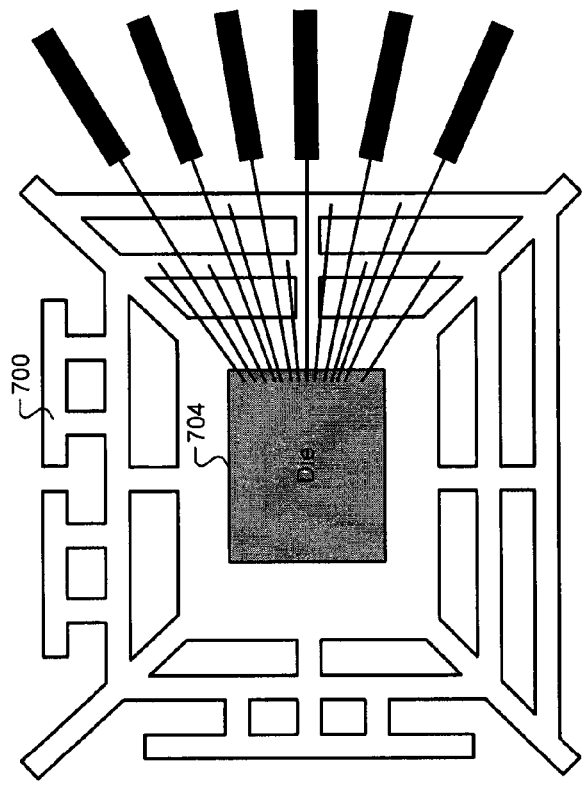

Referring now to FIG. 17, a frame 700 is shown with a die 704. In FIG. 18, interconnecting portions of the frame 700 have been removed. A plane/ring 708 may include an elevated ring, similar to FIG. 16. A partial ring 712, a bar 716, and sub-bars 720 and 724 are also formed from the frame 700.

Figure 19:
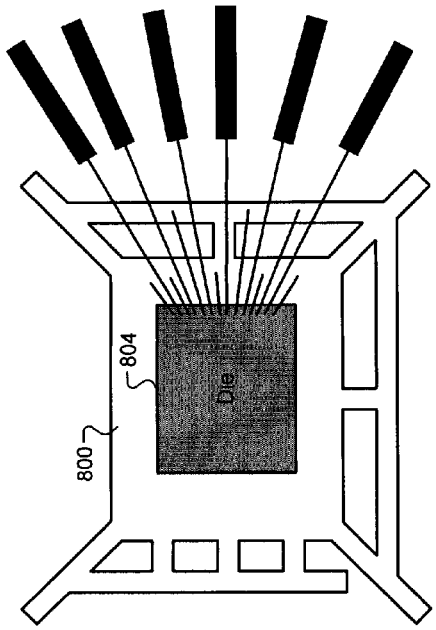
Figure 20:
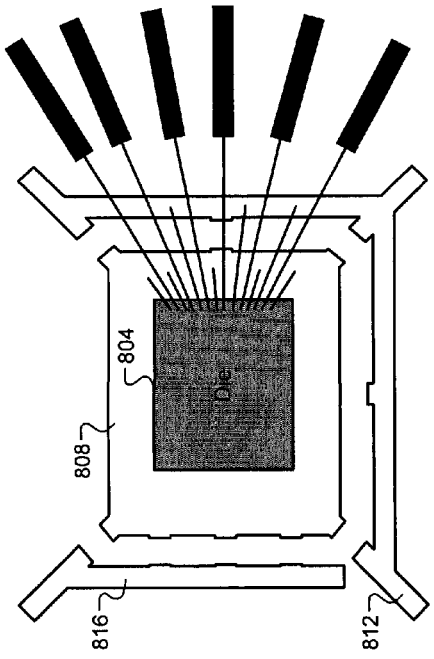

Frames may be created for which part or all of one or more bars are missing. For example only, referring now to FIG. 19, a frame 800 is shown with a die 804. In FIG. 20, interconnecting portions of the frame 800 have been removed. The die 804 is mounted to a plane 808. A partial ring 812 encircles two sides of the plane 808. A bar 816 is formed on a third side of the plane 808.

Together, the partial ring 812 and the bar 816 partially encircle the plane 808, leaving the fourth side of the plane 808 open. By omitting material on the fourth side of the plane 808, the amount of metal required for the frame 800 may be reduced, which may decrease the unit cost of the frame 800. One or more additional rings (not shown) may completely or partially encircle the plane 808. The additional rings may be concentric, and may partially encircle different sides of the plane 808.

Figure 21:
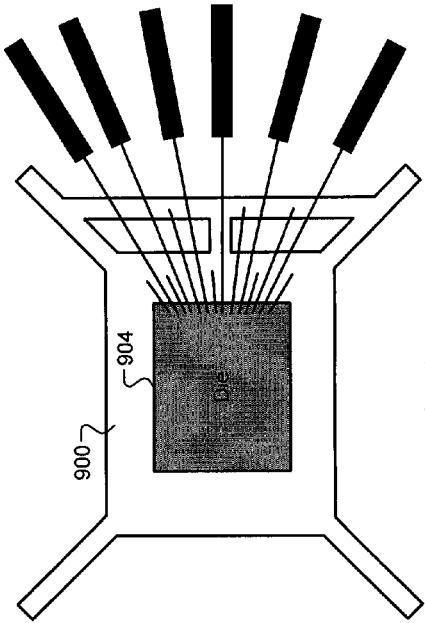
Figure 22:
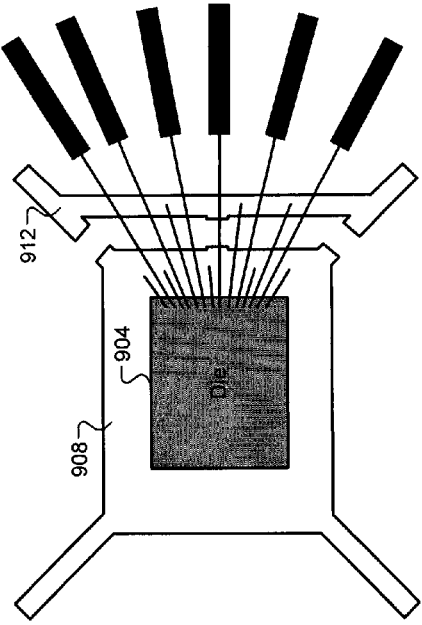

In another example, referring now to FIG. 21, a frame 900 is shown with a die 904. In FIG. 22, interconnecting portions of the frame 900 have been removed. The die 904 is mounted to a plane 908. A bar 912 is located on one side of the plane 908. In this example, the remaining three sides of the plane 908 are open, with no associated bar or ring.

Although various examples have been shown in the preceding figures, additional partial and/or full rings may be included. In addition, any ring may be split into partial rings, bars, or sub-bars. In addition, part or all of any ring may be formed in the same plane as any other ring, or may be elevated or lowered with respect to any other ring.

In addition, although various examples of uses for connections have been given above, additional uses for each section of a frame are possible. In various implementations, a single package may be used with different types of dice. Depending on the particular die, a portion of the frame may perform different functions. For example only, a portion of the frame may be used for analog power if one type of die is attached, while being used for digital power if another type of die is attached. In addition, based on the particular die placed in the package, certain connecting sections may be left in place instead of being removed. This may allow a single frame structure to accommodate multiple configurations of rings and bars.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A packaged semiconductor comprising:
    a conductive frame that is formed as an integral piece of conductive material and that includes
        an inner portion and
        a ring portion encircling the inner portion,
        wherein the ring portion includes (i) a first ring portion that encircles first and second sides of the inner portion, and (ii) a first bar portion located on a third side of the inner portion;
    a semiconductor die that is mounted to a first surface of the inner portion of the conductive frame, and that is configured to receive power via the first ring portion; and
    a casing that supports the conductive frame and covers the semiconductor die, wherein sections of the conductive frame that (i) connect the inner portion to the ring portion or (ii) connect the first ring portion to the first bar portion are removed after the casing is applied to the conductive frame.

2. The packaged semiconductor of claim 1, wherein a face of the ring portion and a face of at least part of the inner portion are exposed on an external surface of the casing.

3. The packaged semiconductor of claim 2, wherein all of the inner portion that is opposite the first surface is exposed on the external surface of the casing.

4. The packaged semiconductor of claim 2, wherein the face of the ring portion and the face of at least part of the inner portion are flush with a bottom surface of the casing.

5. The packaged semiconductor of claim 2, wherein the face of the ring portion and the face of at least part of the inner portion protrude beyond a bottom surface of the casing.

6. The packaged semiconductor of claim 2, further comprising:
    a plurality of leads that are exposed on the external surface of the casing; and
    a plurality of bond wires that respectively connect the plurality of leads to the semiconductor die.

7. The packaged semiconductor of claim 1, wherein the first surface of the inner portion defines a first plane, and wherein the ring portion is formed co-planar with the first plane.

8. The packaged semiconductor of claim 1, wherein:
    the first surface of the inner portion defines as first plane,
    the ring portion is formed co-planar with the first plane,
    the inner portion includes an elevated ring that that is formed in a second plane, and
    the second plane is parallel to and spaced apart from the first plane.

9. The packaged semiconductor of claim 8, further comprising a plurality of bond wires that connect the semiconductor die to the elevated ring.

10. The packaged semiconductor of claim 1, further comprising a plurality of and wires that connect the semiconductor die to the ring portion.

11. The packaged semiconductor of claim 1, further comprising a plurality of bond wires that connect the semiconductor die to the inner portion.

12. The packaged semiconductor of claim 11, further comprising an insulating material between the semiconductor die and the inner portion.

13. The packaged semiconductor of claim 1, wherein the casing includes an encapsulating material.

14. The packaged semiconductor of claim 1, wherein the semiconductor die is a system-on-chip.

15. A printed circuit board comprising the packaged semiconductor of claim 1.

16. The packaged semiconductor of claim 1, wherein the semiconductor die is configured to (i) receive power for a first function from the first, ring portion, (ii) receiver power for a second function from the first bar portion, and (iii) connect to a ground potential via the inner portion.

17. The packaged semiconductor of claim 16 wherein the first function comprises digital circuitry, and wherein the second function comprises analog circuitry.

18. The packaged semiconductor of claim 1, wherein the ring portion further includes a first sub-bar portion and a second sub-bar portion, wherein the first sub-bar portion and the second sub-bar portion are located on a fourth side of the inner portion, and wherein sections of the conductive frame that (i) connect the first sub-bar portion to the second sub-bar portion or (ii) connect the first sub-bar portion to the first ring portion are removed after the casing is applied to the conductive frame.

19. The packaged semiconductor of claim 1, wherein the first ring portion encircles a fourth side of the inner portion.

* * * * *